United States Patent
Koulakis et al.

(10) Patent No.: US 12,160,220 B2
(45) Date of Patent: Dec. 3, 2024

(54) TRANSVERSELY-EXCITED FILM BULK ACOUSTIC RESONATOR WITH OXIDE STRIP ACOUSTIC CONFINEMENT STRUCTURES

(71) Applicant: Murata Manufacturing Co., Ltd., Nagaokakyo (JP)

(72) Inventors: John Pandelis Koulakis, Los Angeles, CA (US); Sean McHugh, Santa Barbara, CA (US); Greg Dyer, Santa Barbara, CA (US); Bryant Garcia, Mississauga (CA); Filip Iliev, San Francisco, CA (US); Julius Koskela, Helsinki (FI); Patrick Turner, San Bruno, CA (US); Neal Fenzi, Santa Barbara, CA (US)

(73) Assignee: Murata Manufacturing Co., Ltd., Nagaokakyo (JP)

(*) Notice: Subject to any disclaimer, the term of this patent is extended or adjusted under 35 U.S.C. 154(b) by 443 days.

(21) Appl. No.: 17/542,290

(22) Filed: Dec. 3, 2021

(65) Prior Publication Data
US 2022/0352867 A1 Nov. 3, 2022

Related U.S. Application Data

(60) Provisional application No. 63/208,503, filed on Jun. 9, 2021, provisional application No. 63/191,897, filed
(Continued)

(51) Int. Cl.
H03H 9/02 (2006.01)
H03H 3/02 (2006.01)
(Continued)

(52) U.S. Cl.
CPC .......... *H03H 9/02228* (2013.01); *H03H 3/02* (2013.01); *H03H 9/02031* (2013.01);
(Continued)

(58) Field of Classification Search
CPC ........ H03H 9/02228; H03H 9/02; H03H 3/02; H03H 9/02031; H03H 9/13; H03H 9/174;
(Continued)

(56) References Cited

U.S. PATENT DOCUMENTS 5,204,575 A 4/1993 Kanda et al.
5,274,345 A 12/1993 Gau
(Continued)

FOREIGN PATENT DOCUMENTS

JP 2020088459 A 6/2020
WO 2015182521 A1 12/2015
(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8 Sep. 6, 2017.
(Continued)

*Primary Examiner* — Diana J. Cheng
(74) *Attorney, Agent, or Firm* — ArentFox Schiff LLP

(57) ABSTRACT

Acoustic resonators, filters, and methods. An acoustic resonator includes a substrate, piezoelectric plate, and a diaphragm comprising a portion of the piezoelectric plate spanning a cavity in a substrate. An interdigital transducer (IDT) on a front surface of the piezoelectric plate includes first and second sets of interleaved interdigital transducer (IDT) fingers extending from first and second busbars respectively. The interleaved IDT fingers are on the diaphragm. Overlapping portions of the interleaved IDT fingers
(Continued)

define an aperture of the acoustic resonator. A first dielectric strip overlaps the IDT fingers in a first margin of the aperture and extends into a first gap between the first margin and the first busbar. A second dielectric strip overlaps the IDT fingers in a second margin of the aperture and extends into a second gap between the second margin and the second busbar.

20 Claims, 15 Drawing Sheets

Related U.S. Application Data on May 21, 2021, provisional application No. 63/187,932, filed on May 12, 2021, provisional application No. 63/182,465, filed on Apr. 30, 2021.

(51) Int. Cl.
  *H03H 9/13* (2006.01)
  *H03H 9/17* (2006.01)
  *H03H 9/56* (2006.01)

(52) U.S. Cl.
  CPC .............. *H03H 9/13* (2013.01); *H03H 9/174* (2013.01); *H03H 9/176* (2013.01); *H03H 9/562* (2013.01); *H03H 9/564* (2013.01); *H03H 2003/023* (2013.01)

(58) Field of Classification Search
  CPC ........ H03H 9/176; H03H 9/562; H03H 9/564; H03H 2003/02
  See application file for complete search history.

(56) References Cited

U.S. PATENT DOCUMENTS

| | | |
|---|---|---|
| 5,446,330 A | 8/1995 | Eda et al. |
| 5,552,655 A | 9/1996 | Stokes et al. |
| 5,726,610 A | 3/1998 | Allen et al. |
| 5,729,186 A | 3/1998 | Seki et al. |
| 5,853,601 A | 12/1998 | Krishaswamy et al. |
| 6,172,582 B1 | 1/2001 | Hickernell |
| 6,271,617 B1 | 8/2001 | Yoneda et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 7,009,468 B2 | 3/2006 | Kadota et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi et al. |
| 9,525,398 B1 | 12/2016 | Olsson et al. |
| 9,640,750 B2 | 5/2017 | Nakanishi et al. |
| 9,748,923 B2 | 8/2017 | Kando et al. |
| 9,748,924 B2 | 8/2017 | Komatsu et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski et al. |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski et al. |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev et al. |
| 11,165,407 B2 | 11/2021 | Yantchev et al. |
| 11,171,629 B2 | 11/2021 | Turner |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0042998 A1 | 3/2003 | Edmonson |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0261250 A1 | 12/2004 | Kadota et al. |
| 2005/0077982 A1 | 4/2005 | Funasaka |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0152107 A1 | 7/2006 | Tanaka |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0019866 A1 | 1/2010 | Hara et al. |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0278993 A1 | 11/2011 | Iwamoto |
| 2012/0073390 A1 | 3/2012 | Zaghloul et al. |
| 2012/0198672 A1 | 8/2012 | Ueda et al. |

(56) References Cited

U.S. PATENT DOCUMENTS

| | | |
|---|---|---|
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0147577 A1 | 6/2013 | Nishihara et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0014795 A1 | 1/2015 | Franosch et al. |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182009 A1 | 6/2016 | Bhattacharjee |
| 2017/0063332 A1 | 3/2017 | Gilbert et al. |
| 2017/0077902 A1 | 3/2017 | Daimon |
| 2017/0179225 A1 | 6/2017 | Kishimoto |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0278227 A1 | 9/2018 | Hurwitz |
| 2018/0309426 A1 | 10/2018 | Guenard et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386636 A1 | 12/2019 | Plesski et al. |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0162052 A1 | 5/2020 | Matsuoka et al. |
| 2020/0235719 A1 | 7/2020 | Yantchev et al. |
| 2020/0259480 A1 | 8/2020 | Pensala |
| 2020/0274520 A1 | 8/2020 | Shin et al. |
| 2020/0313645 A1 | 10/2020 | Caron |
| 2020/0350891 A1 | 11/2020 | Turner |
| 2021/0013859 A1 | 1/2021 | Turner et al. |
| 2021/0067134 A1 | 3/2021 | Fujiwara |
| 2021/0265978 A1 | 8/2021 | Plesski et al. |
| 2021/0328574 A1 | 10/2021 | Garcia |
| 2021/0351762 A1 | 11/2021 | Dyer et al. |
| 2023/0336143 A1 | 10/2023 | Tetsuya |

FOREIGN PATENT DOCUMENTS

| | | |
|---|---|---|
| WO | 2016017104 | 2/2016 |
| WO | 2018003273 | 1/2018 |
| WO | 2019241174 A1 | 12/2019 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190. 00 Mar. 2014.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages. Jun. 5, 2018.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2. 00 May 2018.

Y. Yang, A. Gao et al. "5 Ghz Lithium Niobate Mems Resonators With High FOM of 153", 2017 IEEE 30th International Conference in Micro Electro Mechanical Systems (MEMS). Jan. 22-26, 2017. pp. 942-945 Jan. 22, 2017.

USPTO/ISA, International Search Report and Written Opinion for PCT Application No. PCT/US2019/036433 dated Aug. 29, 2019. Aug. 29, 2019.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi: 10.1002/ecja. 4410690406 00 Jan. 1986.

Safari et al. "Piezoelectric for Transducer Applications"published by Elsevier Science Ltd., pp. 4 (Year: 2000). 00 Jan. 2000.

Buchanan "Ceramic Materials for Electronics" 3rd Edition, first published in 2004 by Marcel Dekker, Inc. pp. 496 (Year 2004). 00 Jan. 2004.

Moussa et al. Review on Triggered Liposomal Drug Delivery with a Focus on Ultrasound2015, Bentham Science Publishers, pp. 16 (Year 2005) 00 Jan. 2005.

Acoustic Properties of SolidsONDA Corporation592 Weddell Drive, Sunnyvale, CA 94089, Apr. 11, 2003, pp. 5 (Year 2003) Apr. 11, 2003.

Sorokin et al.Study of Microwave Acoustic Attenuation in a Multi-frequency Bulk Acoustic Resonator Based on a Synthetic Diamond Single CrystalPublished in Acoustical Physics, vol. 61, No. 6, 2015 pp. 675 (Year 2015) 00 Jan. 2015.

Material Properties of Tibtech Innovations, © 2018 TIBTECH Innovations (Year 2018) 00 Jan. 2018.

Zou, Jie "High-Performance Aluminum Nitride Lamb Wave Resonators for RF Front-End Technology" University of California, Berkeley, Summer 2015, pp. 63 (Year 2015) 00 Jan. 2015.

Bahreynl, B.Fabrication and Design of Resonant MicrodevicesAndrew William, Inc. 2018, NY (Year 2008) 00 Jan. 2008.

International Search Report and Written Opinion for PCT Application No. PCT/US2019/058632 dated Jan. 17, 2020. Jan. 17, 2020.

G. Manohar, Investigation of Various Surface Acoustic Wave Design Configurations for Improved Sensitivity, Jan. 2012, Doctoral dissertation, University of South Florida, USA Jan. 2012.

Ekeom, D. & Dubus, Bertrand & Volatier, A., Solidly mounted resonator (SMR) FEM-BWM simulation, 2006, 1474-1477, 10.1109/ULTSYM.2006.371. 2006.

Santosh, G., Surface acoustic wave devices on silicon using patterned and thin film ZnO, Ph.D. thesis, Feb. 2016, Indian Institute of technology Guwahati, Assam, India Feb. 2016.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Naumenko et al., "Optimal orientations of Lithium Niobate for resonator SAW filters", 2003 IEEE Ultrasonics Symposium—pp. 2110-2113. (Year: 2003) 2003.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

(56) References Cited

OTHER PUBLICATIONS

Webster Dictionary, Meaning of "diaphragm" Merriam Webster since 1828. 1828.
A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).
Gnewuch, et al. "Broadband monolithic acousto-optic tunable filter", Mar. 1, 2000 / vol. 25, No. 5 / Optics Letters (Year: 2000).
Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).
Lin et al., "A novel weighted method for layered SAW filters using slanted finger interdigital transducers", J. Phys. D: Appl. Phys. 39 (2006) pp. 466-470 (Year: 2006).
M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).
M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).
Reinhardt, "Acoustic filters based on thin single crystal LiNbQ,3 films: status and prospects", 2014 IEEE International Ultrasonics Symposium Proceedings, pp. 773-781 (Year: 2014).
Sinha et al., "Slanted finger Inter-digital Transducers for the design of improved performance small shape factor mid-bandwidth SAW filters", IEEE MTT-S International Microwave and RF Conference, 2013. (Year: 2013).
USPTO/ISA, International Search Report and Written Opinion for PCT Application No. PCT/US2021/024824 dated Jul. 27, 2021, 9 total pages.
USPTO/ISA, International Search Report and Written Opinion for PCT Application No. PCT/US2021/048505 dated Dec. 1, 2021, 11 total pages.
Wu et al., "Frequency band-gap measurement of two-dimensional air/silicon phononic crystals using layered slanted finger interdigital transducers", J. Appl. Phys. 97, 094916, 2005 (Year: 2005).

TRANSVERSELY-EXCITED FILM BULK ACOUSTIC RESONATOR WITH OXIDE STRIP ACOUSTIC CONFINEMENT STRUCTURES

RELATED APPLICATION INFORMATION

This patent claims priority from the following provisional patent applications: 63/182,465, filed Apr. 30, 2021, entitled OXIDE STRIP ACOUSTIC CONFINEMENT STRUCTURES FOR Z-CUT LN; 63/187,932, filed May 12, 2021, entitled DUAL OXIDE STRIP ACOUSTIC CONFINEMENT STRUCTURES FOR Z-CUT LN; 63/191,897, filed May 21, 2021, entitled BEST PRACTICES FOR OXIDE STRIP ACOUSTIC CONFINEMENT STRUCTURES; and 63/208,503, filed Jun. 9, 2021, entitled CHIRPED WIDE OXIDE STRIP ACOUSTIC CONFINEMENT STRUCTURES. The entire content of these applications is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz. Matrix XBAR filters are also suited for frequencies between 1 GHz and 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
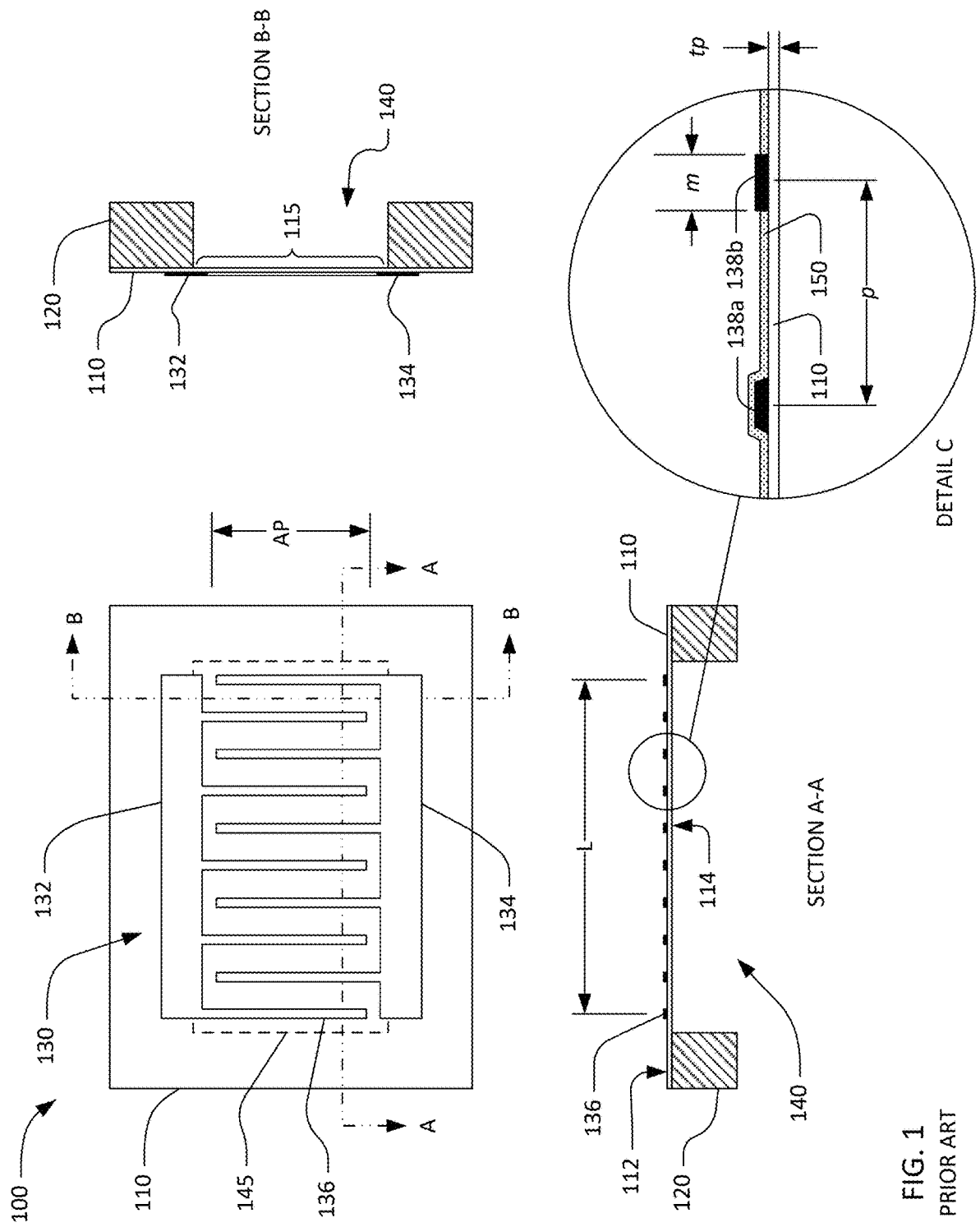
FIG. 1 includes a schematic plan view, two schematic cross-sectional views, and a detail view of a transversely-excited film bulk acoustic resonator (XBAR).

FIG. 1 shows a simplified schematic top view, orthogonal cross-sectional views, and a detailed cross-sectional view of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The direction parallel to the IDT fingers will be referred to herein as the "aperture direction". The center-to-center distance L between the outermost fingers of the IDT 130 is the "length" of the IDT. The direction perpendicular to the IDT fingers will be referred to herein as the "length direction."

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate which spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and mark ("mark" is a term commonly used to refer to the dimension perpendicular to the long axis of a conductor such as an IDT finger) of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

Referring to the detailed cross-sectional view (Detail C), a front-side dielectric layer 150 may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138*b*) or may be deposited as a blanket layer such that the dielectric layer is formed both between and over the IDT fingers (e.g. IDT finger 138*a*). The front-side dielectric layer 150 may be a non-piezoelectric dielectric material, such as silicon dioxide or silicon nitride. The thickness of the front side dielectric layer is typically less than or equal to the thickness of the piezoelectric plate. The front-side dielectric layer 150 may be formed of multiple layers of two or more materials.

The IDT fingers 138*a* and 138*b* may be aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars 132, 134 of the IDT may be made of the same or different materials as the fingers.

Dimension p is the center-to-center spacing or "pitch" of the IDT fingers, which may be referred to as the pitch of the IDT and/or the pitch of the XBAR. Dimension m is the mark of the IDT fingers.

As shown in DETAIL C, IDT finger 138*a* has a trapezoidal cross-sectional shape and IDT finger 138*b* has a rectangular cross-sectional shape. The IDT fingers 138*a*, 138*b* may have some other cross-section, such as T-shaped or stepped. The IDT fingers 138*a*, 138*b* are shown as single layer structures which may be aluminum or some other metal. IDT fingers may include multiple layers of materials, which may be selected to have different acoustic loss and/or different acoustic impedance. When multiple material layers are used, the cross-sectional shapes of the layers may be different. Further, a thin adhesion layer of another material, such as titanium or chrome, may be formed between the IDT fingers 138*a*, 138*b* and the piezoelectric plate 110. Although not shown in FIG. 1, some or all IDT fingers may be disposed in grooves or slots extending partially or completely through the piezoelectric plate 110.

An XBAR based on shear acoustic wave resonances can achieve better performance than current state-of-the art surface acoustic wave (SAW), film-bulk-acoustic-resonators (FBAR), and solidly-mounted-resonator bulk-acoustic-wave (SMR BAW) devices. In particular, the piezoelectric coupling for shear wave XBAR resonances can be high (>20%) compared to other acoustic resonators. High piezoelectric coupling enables the design and implementation of microwave and millimeter-wave filters of various types with appreciable bandwidth.

Figure 2B:
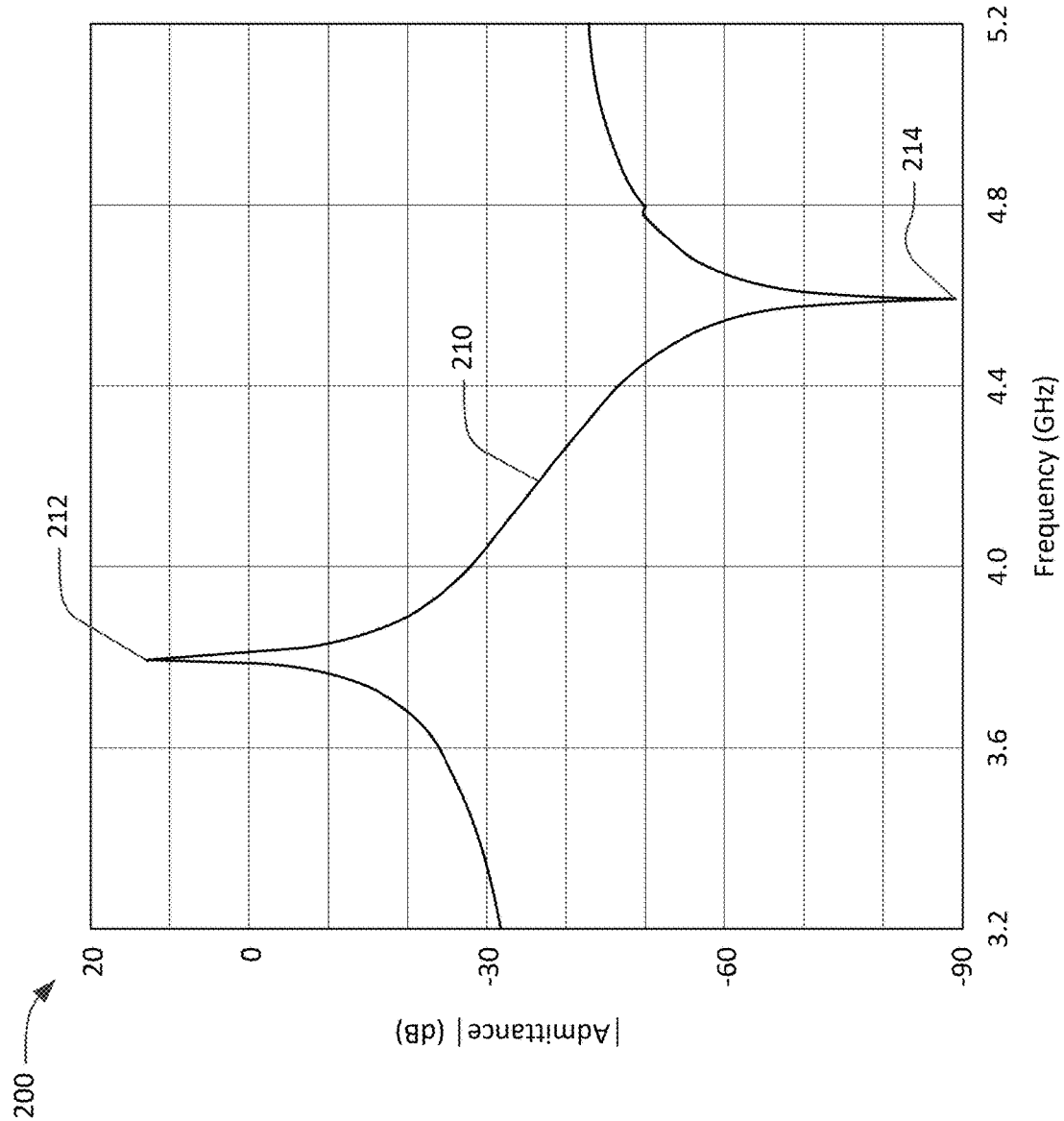
FIG. 2B is a graph of the magnitude of admittance of an ideal acoustic resonator.
Figure 2A:
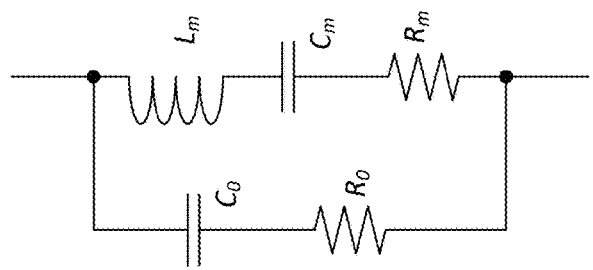
FIG. 2A is an equivalent circuit model of an acoustic resonator.

The basic behavior of acoustic resonators, including XBARs, is commonly described using the Butterworth Van Dyke (BVD) circuit model as shown in FIG. 2A. The BVD circuit model consists of a motional arm and a static arm. The motional arm includes a motional inductance $L_m$, a motional capacitance $C_m$, and a resistance $R_m$. The static arm includes a static capacitance $C_0$ and a resistance $R_0$. While the BVD model does not fully describe the behavior of an acoustic resonator, it does a good job of modeling the two primary resonances that are used to design band-pass filters, duplexers, and multiplexers (multiplexers are filters with more than 2 input or output ports with multiple passbands).

The first primary resonance of the BVD model is the motional resonance caused by the series combination of the motional inductance $L_m$ and the motional capacitance $C_m$. The second primary resonance of the BVD model is the anti-resonance caused by the combination of the motional inductance $L_m$, the motional capacitance $C_m$, and the static capacitance $C_0$. In a lossless resonator ($R_m=R_0=0$), the frequency $F_r$ of the motional resonance is given by $$F_r = \frac{1}{2\pi\sqrt{L_m C_m}} \quad (1)$$

The frequency $F_a$ of the anti-resonance is given by $$F_a = F_r\sqrt{1 + \frac{1}{\gamma}} \quad (2)$$

where $\gamma = C_0/C_m$ is dependent on the resonator structure and the type and the orientation of the crystalline axes of the piezoelectric material.

FIG. 2B is a graph 200 of the performance of a theoretical lossless acoustic resonator. Specifically, the solid curve 210 is a plot of the magnitude of admittance of the acoustic resonator as a function of frequency. The acoustic resonator has a resonance 212 at a resonance frequency where the admittance of the resonator approaches infinity. The resonance is due to the series combination of the motional inductance $L_m$ and the motional capacitance $C_m$ in the BVD model of FIG. 2A. The acoustic resonator also exhibits an anti-resonance 214 where the admittance of the resonator approaches zero. The anti-resonance is caused by the combination of the motional inductance $L_m$, the motional capacitance $C_m$, and the static capacitance $C_0$. In a lossless resonator ($R_m=R_0=0$), the frequency $F_r$ of the resonance is given by $$F_r = \frac{1}{2\pi\sqrt{L_m C_m}} \quad (1)$$

The frequency $F_a$ of the anti-resonance is given by $$F_a = F_r \sqrt{1 + \frac{1}{\gamma}} \quad (2)$$

In over-simplified terms, the lossless acoustic resonator can be considered a short circuit at the resonance frequency 212 and an open circuit at the anti-resonance frequency 214. The resonance and anti-resonance frequencies in FIG. 2B are representative, and an acoustic resonator may be designed for other frequencies.

Figure 3:
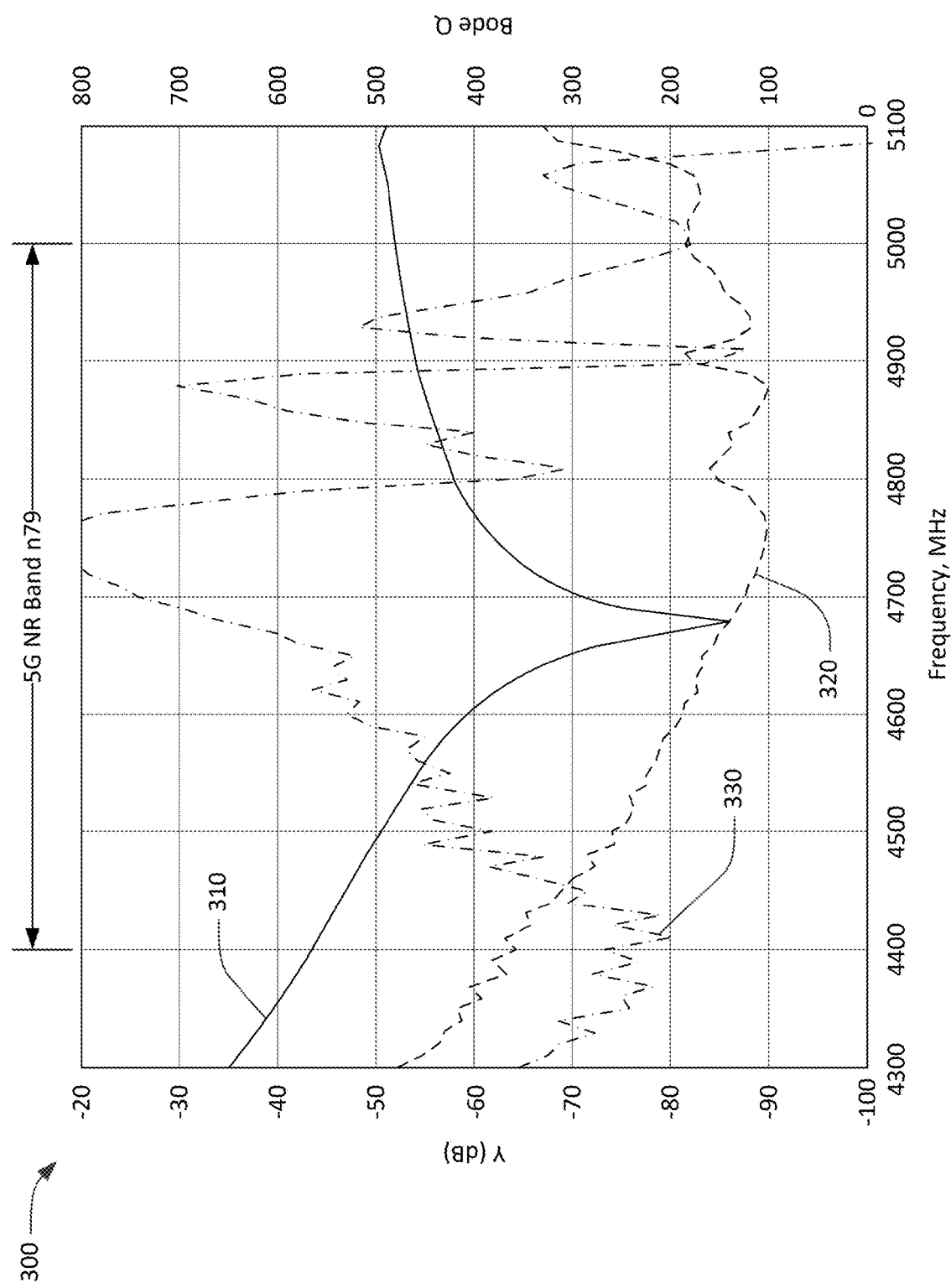
FIG. 3 is a graph of the admittance and Bode Q of a representative XBAR as functions of frequency.

FIG. 3 shows a graph 300 showing the performance of an exemplary XBAR. The data for FIG. 3 and all subsequent graphs results from simulation of exemplary XBAR devices using a finite element three-dimensional simulation technique.

Specifically, the solid curve 310 is a plot of the magnitude of admittance of the exemplary XBAR as a function of frequency. The dashed line 320 is a plot of the real component of admittance for the XBAR. The curves 310 and 320 are read using the left-hand vertical axis. The exemplary XBAR includes a Z-cut lithium niobate piezoelectric plate with a thickness of 0.368 um. The IDT pitch is 4.4 um, and the IDT finger mark is 0.96 um. The IDT mark/pitch ratio is 0.22. The IDT is predominantly aluminum with a total thickness of 0.491 um. The gap between the ends of the IDT fingers and the adjacent busbar is 5.0 um. The XBAR has a resonance frequency about 4250 MHz (not shown) and an anti-resonance frequency about 4680 MHz. The exemplary XBAR may be, for example, a shunt resonator for a band n79 bandpass filter. The frequency range of the graph 300 spans the n79 band from 4400 MHz to 5000 MHz which includes the admittance minimum at the anti-resonance of the XBAR.

The dot-dash curve 330 is a plot of the Bode Q-factor for the XBAR. Bode Q-factor is a measure of the efficiency of a resonator and is equal to $2\pi$ times the peak energy stored during a cycle of the input signal divided by the total energy dissipated during the cycle. The curve 330 is read against the right-hand vertical axis.

Figure 4:
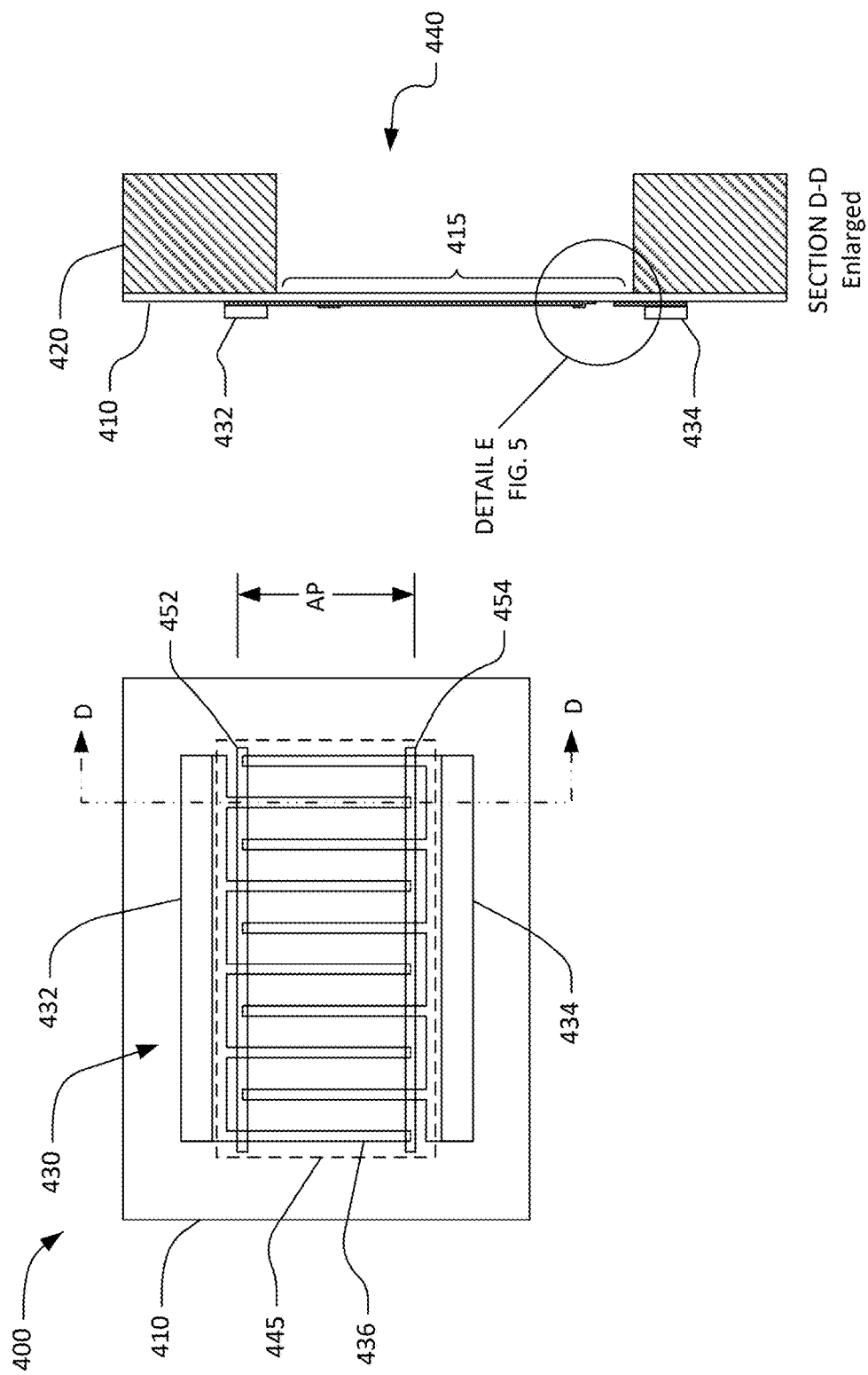
FIG. 4 includes a schematic plan view and an enlarged schematic cross-sectional view of an XBAR with an oxide strip acoustic confinement structure.

FIG. 4 shows a simplified schematic top view and enlarged cross-sectional view of a transversely-excited film bulk acoustic resonator (XBAR) 400. The XBAR 400 is generally similarly to the XBAR 100 of FIG. 1 with the addition of a first dielectric strip acoustic confinement structure (ACS) 452 and a second dielectric strip ACS 454.

The XBAR 400 includes a thin film conductor pattern formed on a surface of a piezoelectric plate 410. The piezoelectric plate 410 may be a thin plate of a single-crystal piezoelectric material. The material and the crystal orientation of the piezoelectric plate 410 may be as previously described.

A back surface of the piezoelectric plate 410 is attached to a surface of a substrate 420 except for a portion of the piezoelectric plate 410 that forms a diaphragm 415 spanning a cavity 440 formed in the substrate. The substrate 420 may be, for example, silicon, sapphire, quartz, or some other material or combination of materials. The piezoelectric plate 410 and the substrate 420 may be bonded or attached as previously described.

The conductor pattern of the XBAR 400 includes an interdigital transducer (IDT) 430. The IDT 430 includes a first plurality of parallel fingers, such as finger 436, extending from a first busbar 432 and a second plurality of fingers extending from a second busbar 434. The first and second pluralities of parallel fingers are interleaved. The interleaved fingers overlap for a distance AP, commonly referred to as the "aperture" of the IDT. The direction parallel to the IDT fingers will be referred to herein as the "aperture direction". The center-to-center distance L between the outermost fingers of the IDT 430 is the "length" of the IDT. The direction perpendicular to the IDT fingers will be referred to herein as the "length direction." The IDT 430 is positioned on the piezoelectric plate 410 such that at least the fingers of the IDT 430 are disposed on the diaphragm 415. The materials of the conductor pattern may be as previously described.

Each dielectric strip ACS 452, 454 is a strip of dielectric material that overlaps the IDT fingers at the margins of the aperture and extends into the gap between the ends of the IDT fingers and the adjacent busbars. In this context, the term "margin" means "the extreme edge of something and the area lying parallel to and immediately adjoining this edge especially when in some way distinguished from the remaining area lying farther in." In this case the margins of the aperture are distinguished by the presence of the dielectric strip ACS overlapping the IDT fingers.

The first dielectric strip ACS 452, which is proximate the first busbar 432, overlaps the IDT fingers in a first margin of the aperture. The first dielectric strip ACS 452 extends into the gap between the first busbar and ends of the IDT fingers extending from the second busbar. The second dielectric strip ACS 454 overlaps the IDT fingers in a second margin of the aperture. The second dielectric strip ACS 454 extends into the gap between the second busbar and ends of the IDT fingers extending from the first busbar.

The first and second dielectric strips ACS 452, 454 extend the entire length of the IDS 430, which is to say the ACS overlaps the ends of all the fingers of the IDT. The ACS 452, 454 may extend beyond the length of the IDT 430 as shown in FIG. 4. The dielectric strips may be silicon dioxide, silicon nitride, aluminum oxide, titanium dioxide, titanium nitride, diamond, or some other dielectric material. In all of the subsequent examples, the dielectric strips are silicon dioxide.

Figure 5:
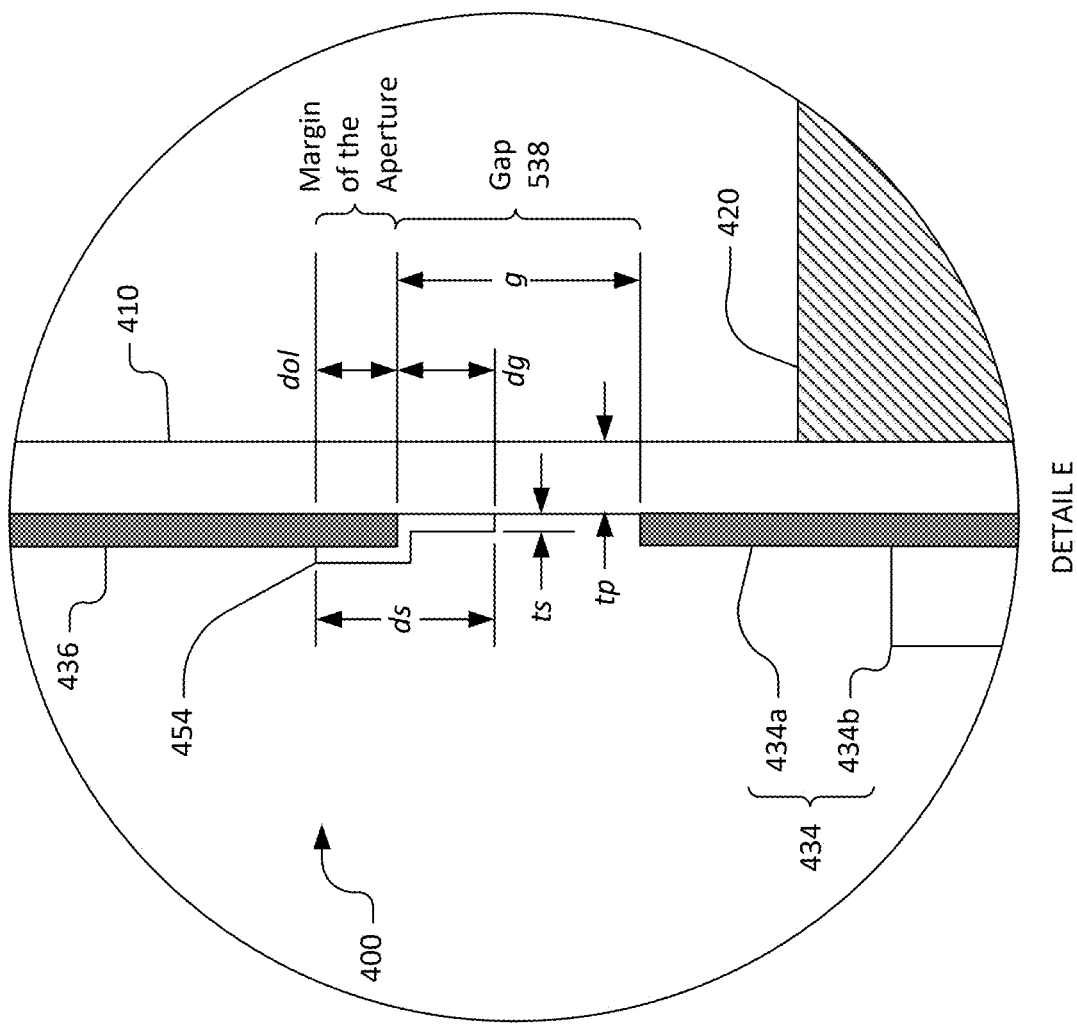
FIG. 5 is a detailed cross-sectional view of the acoustic confinement structure of FIG. 4.

FIG. 5 is a detailed cross-sectional view of a portion of XBAR 400 identified as "Detail E" in FIG. 4. FIG. 5 shows portions of the piezoelectric plate 410 and the substrate 420. An IDT finger 436 and a portion 434a of the second bus bar 434 are formed in a first conductor level. The bus bar 434 typically includes a second conductor level 434b. The gap 538 between the end of the IDT finger 436 and the portion of the busbar 434a has a width g. The term "width" means a dimension in the aperture direction (measured parallel to the long direction of the IDT fingers).

The dielectric strip ACS 454 has a total width of ds, of which a first portion with a width dol overlaps the IDT finger 436 in the margin of the aperture, and a second portion with a width dg is disposed on the diaphragm 410 in the gap 538. dg is less than g such that the second portion of the dielectric strip ACS 454 does not span the gap 538. The thickness is of the dielectric strip ACS may be between 4 nm and 30 nm. The thickness td of the piezoelectric plate 410 may be between 100 nm and 1000 nm. The effect of the thickness of the dielectric strip ACS will be discussed subsequently.

Figure 6:
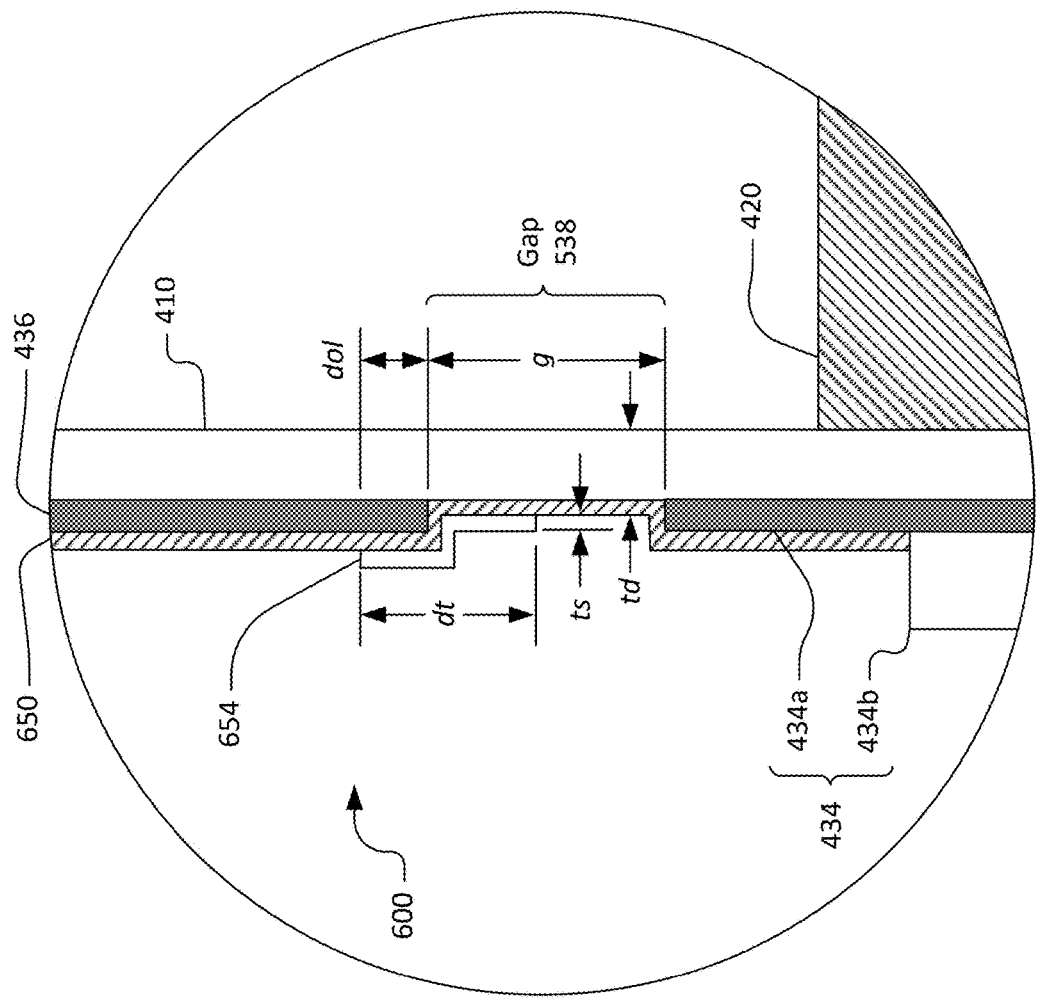
FIG. 6 is a detailed cross-sectional view of another acoustic confinement structure.

FIG. 6 is a detailed cross-sectional view of a portion of another XBAR 600. The XBAR 600 is similar to the XBAR 400 shown in FIG. 5 with the addition of a dielectric layer 650 over the surface of the diaphragm 410 and the IDT finger 436. All of the other elements and dimensions of the XBAR 600 are the same as the corresponding elements of the XBAR 400.

In the example of FIG. 6, the ACS 654 is over (i.e. further from the piezoelectric plate 410) the dielectric layer 950, which implies the ACS 654 was formed after the dielectric layer 650. The converse, with the dielectric layer 650 over the ACS 954, is also possible. In some embodiments, a first dielectric layer 650 may be under the ACS 954 and a second dielectric layer (not shown) may be over the ACS 654. For example, the first dielectric layer may be a frequency-setting layer, as described in U.S. Pat. No. 10,917,070, and the second dielectric layer may be a passivation layer to seal the conductor pattern and other surfaces of the XBAR 600.

In the examples of FIG. 7, FIG. 8, FIG. 9 and FIG. 11, the piezoelectric plate 410 is Z-cut lithium niobate with a thickness of 370 nm. The dielectric layer 650 is silicon dioxide with a thickness of 130 nm. The total diaphragm thickness td is 500 nm.

Figure 7:
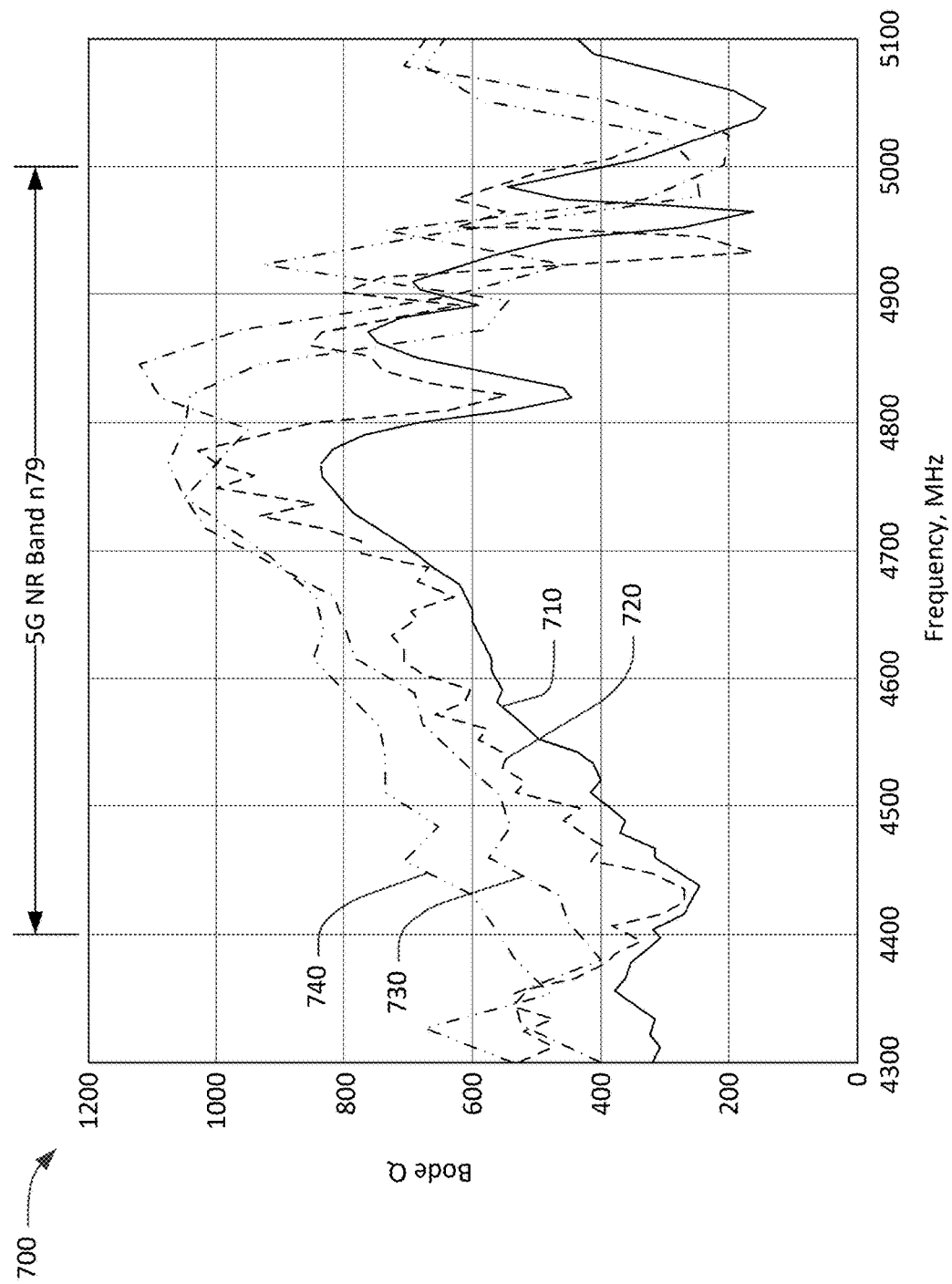
FIG. 7 is a graph comparing the Bode Q of XBARs with different acoustic confinement structures.

FIG. 7 shows a graph 700 illustrating the benefit of a dielectric strip ACS. Specifically, the solid curve 710 is a plot of the Bode Q of an exemplary XBAR without an ACS. The curve 710 is the same as the curve 330 of FIG. 3 with a different vertical scale.

The characteristics of XBAR devices scale with frequency. Frequency, in turn, is inversely dependent on the thickness of the diaphragm including the piezoelectric plate and any dielectric layers. To facilitate the design of XBARs for applications and frequencies other than the n79 shunt resonator used in all of the examples in this patent, it is convenient to express dimension relative to the thickness td of the diaphragm. For all of the examples in this patent, the diaphragm thickness td is 0.50 µm.

The dashed curve 720 is a plot of the Bode Q of a similar XBAR with a dielectric strip in the margins of the aperture. The dielectric strip has a width of 0.68 µm and does not extend into the gap between the ends of the IDT fingers and the busbars. Referring to the dimensions defined in FIG. 5, this dielectric strip has ds=dol=0.68 µm=1.36 td, and dg=0.

The dot-dash curve 730 is a plot of the Bode Q of a similar XBAR with a dielectric strip only in the gaps between the ends of the IDT fingers and the busbars. The dielectric strips have a width of 1 µm and are positioned 0.2 µm from the ends of the IDT fingers. Referring to the dimensions defined in FIG. 5, this dielectric strip has dol=0 and ds=dg=1.0 µm=2.0td.

The dot-dot-dash curve 740 is a plot of the Bode Q of a similar XBAR with a dielectric strip ACS that overlaps the ends of the IDT fingers and extends into the gaps as shown in FIG. 5. Referring to the dimensions defined in FIG. 5, this dielectric strip has ds=2.2 µm=4.4td; dol=1.0 µm=2.0td; and dg=1.2 µm=2.4td.

Comparison of the curves 710, 720, 730, and 740 shows that the addition of a narrow (i.e. ds=2.0td) dielectric strip either on the IDT fingers or in the gap (curves 720, 730) provides an improvement in Bode Q near the lower band edge. The wide dielectric strip (ds=4.4td, curve 740) that overlaps the ends of the IDT fingers and extends into the gaps provides higher Bode Q near the lower band edge than either of the narrow dielectric strips.

The presence of a dielectric strip ACS improves Bode Q between the resonance and antiresonance frequencies but may reduce Bode Q at frequencies lower than resonance and above antiresonance. Overall, this can be a beneficial tradeoff. The sharpness of a filter transfer function at its lower band edge depends mostly on the Bode Q of shunt resonators between resonance and antiresonance, the contribution from series resonators can be limiting if their Bode Q at the lower band edge is too low. Similarly, while the Bode Q of the series resonators is most important at the upper band edge, the sharpness of the upper band edge may be limited if the Bode Q of shunt resonators is too low. The design of a filter is a continuous tradeoff of factors including the geometry of the dielectric strip ACS on each resonator.

For XBARs using Z-cut lithium niobate piezoelectric plates, the primary effect that limits Bode Q between resonance and antiresonance is excitation of unwanted obliquely traveling waves in a finite aperture device. Adding a dielectric strip ACS suppresses the excitation of unwanted oblique waves. Losses due to excitation of obliquely traveling waves are unrelated to coupling to the y-component of the electric field. That is a separate and relatively negligible source of loss which is dwarfed in comparison to the excitation of oblique waves. Obliquely traveling waves are excited because of the mechanical difference between the IDT and gap region, which the dielectric strip addresses.

Figure 8:
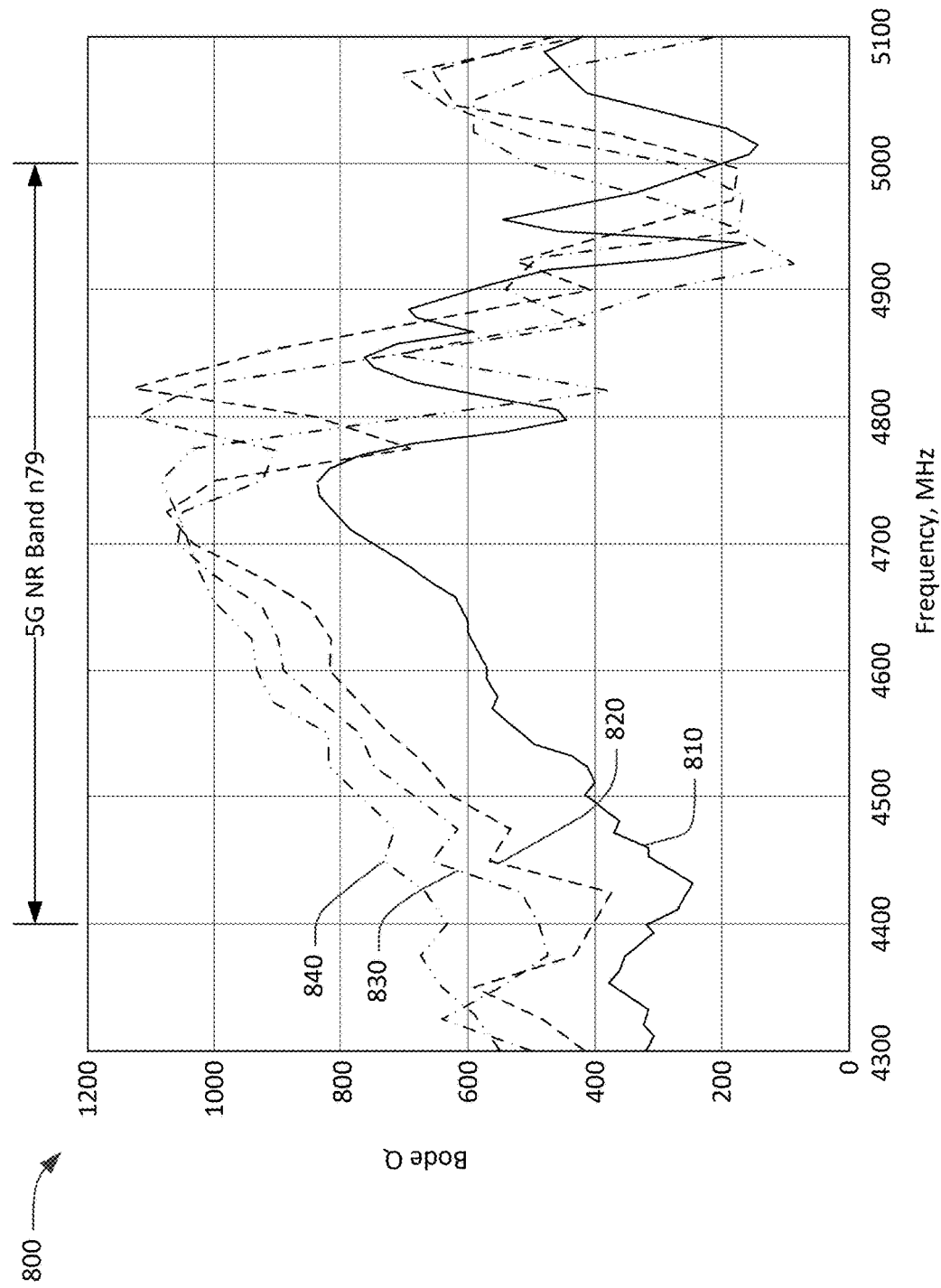
FIG. 8 is a graph comparing the Bode Q of XBARs with different acoustic confinement structures.

FIG. 8 shows a graph 800 illustrating the relationship between Bode Q and the thickness of a dielectric strip ACS. Specifically, the solid curve 810 is a plot of the Bode Q of an exemplary XBAR without an ACS. The curve 810 is the same as the curve 330 of FIG. 3 with a different vertical scale. The other three curves are plots of the Bode Q of similar XBARs with wide dielectric strip ACSs of differing thickness that overlap the ends of the IDT fingers and extend into the gaps. The dimensions of the ACSs for curves 720, 730, and 740 are ds=5.3td, dol=1.3td, and dg=4.0td.

The dashed curve 820 is a plot of the Bode Q of a similar XBAR with a wide dielectric strip ACS with a thickness ts equal to 4 nm or 0.008td. The dot-dash curve 830 is a plot of the Bode Q of another XBAR with a similar dielectric strip ACS with a thickness ts=8 nm or 0.016td. The dot-dot-dash curve 840 is a plot of the Bode Q of another XBAR with a thickness ts=15 nm or 0.030td.

Comparison of the curves 810, 820, 830, and 840 shows that a wide dielectric strip ACS with a thickness of only 0.008td provides a significant improvement in Bode Q near the lower band edge. The Bode Q near the lower band edge improves with increasing dielectric strip thickness up to at least 0.030td. There is small additional improvement in Bode Q for thicker dielectric strips, but other losses may become significant for dielectric strips with ts≥0.06td.

Figure 9:
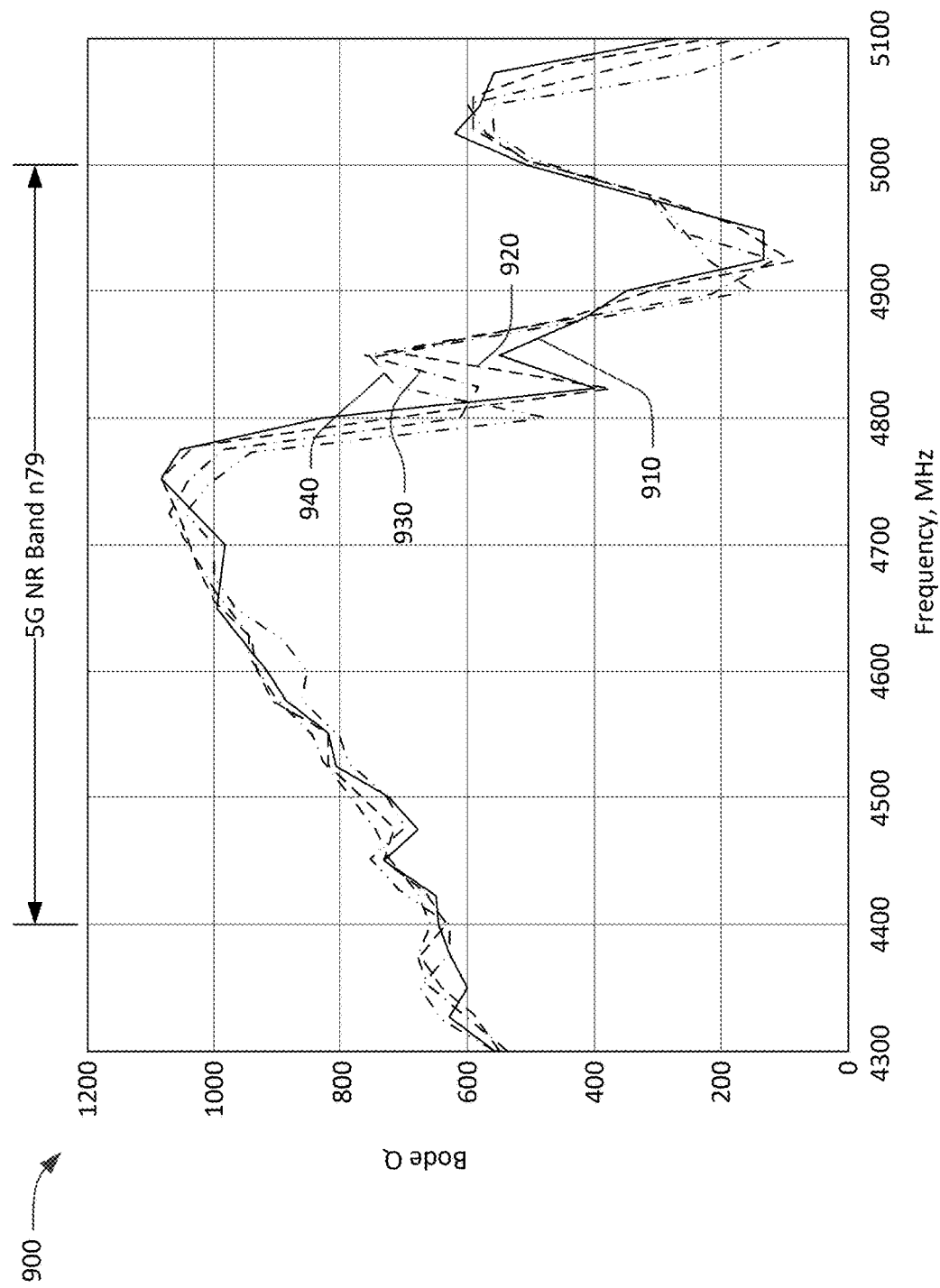
FIG. 9 is a graph comparing the Bode Q of XBARs with different acoustic confinement structures.

FIG. 9 shows a graph 800 illustrating the relationship between Bode Q and the overlap of a dielectric strip ACS with the IDT fingers of an XBAR. Specifically, the curves 910, 920, 930, and 940 are plots of the Bode Q of exemplary XBARS with dielectric strip ACS having dimensions (as defined in FIG. 5) dg=2.2 µm=4.4td and is =15 nm=0.03td.

The solid curve 910 is a plot of the Bode Q of an exemplary XBAR with a dielectric strip ACS with dol=0.3 µm=0.60td. The dashed curve 920 is a plot of the Bode Q of an exemplary XBAR with a dol=0.7 µm=1.40td. The dot-dash curve 930 is a plot of the Bode Q of an exemplary XBAR with dol=1.0 µm=2.0td. The dot-dot-dash curve 940 is a plot of the Bode Q of an exemplary XBAR with a dielectric strip ACS with dol=1.5 µm=3.0td. Comparison of the curves 910, 920, 930, 940 shows there is little dependence of Bode Q on the overlap distance dol, particularly for frequencies near the lower edge of the n79 band, over the ranges 0.6td≤dol≤3.0td and 4.0td≤ds≤8.0td.

Figure 10:
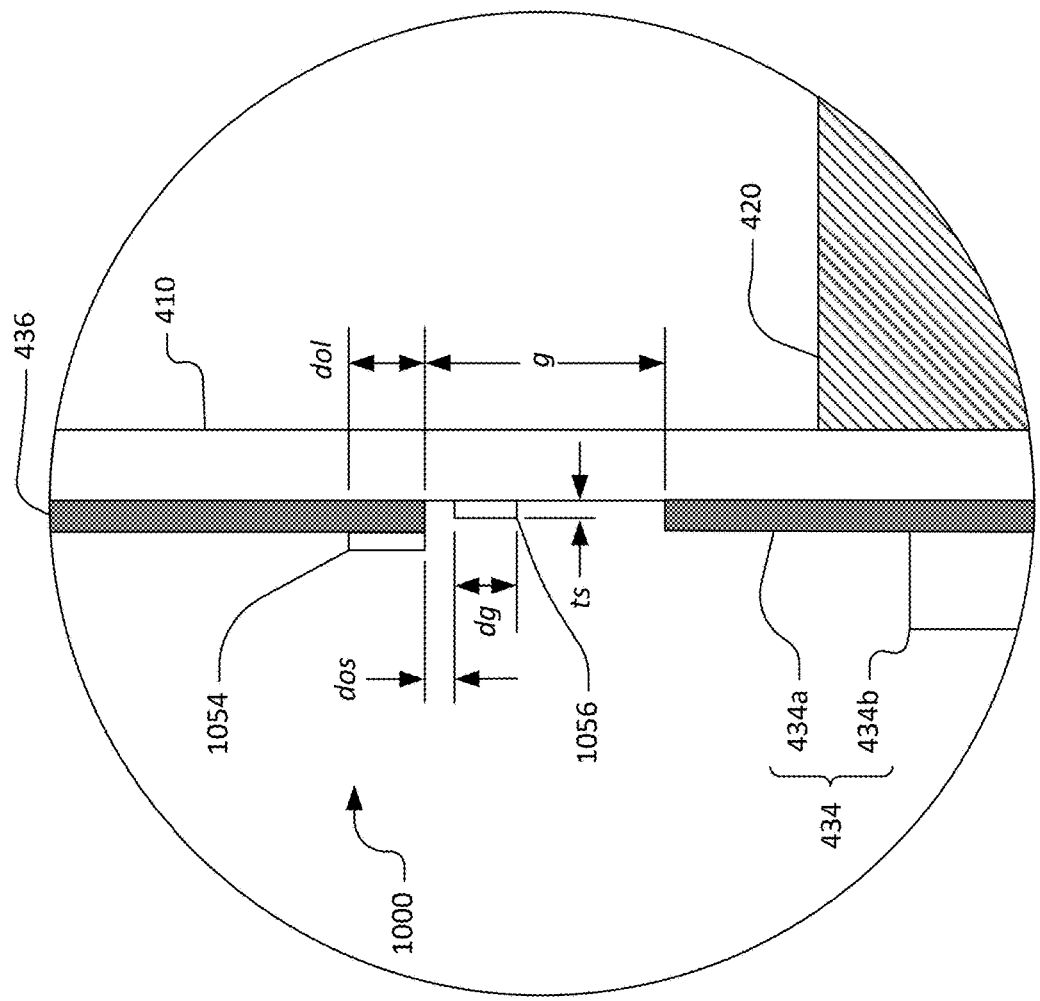
FIG. 10 is a detailed cross-sectional view of another acoustic confinement structure.

FIG. 10 is a detailed cross-sectional view of a portion of another XBAR 1000. The XBAR 1000 is similar to the XBAR 400 shown in FIG. 5 except that the ACS is separated into a first portion 1054 that overlaps the ends on the IDT conductor 436 in the margins of the aperture and a second portion, 1056 on the surface of the diaphragm 410 in the gap between the ends of the IDT fingers 436 and the busbar 434. The first and second portions 1054, 1056 are not contiguous, but are separate by a small distance. The width, in the aperture direction, of the first portion is do1 and the width of the second portion is dg. The distance between the first and second portions 1054, 1056 is dos. All of the other elements and dimensions of the XBAR 1000 are the same as the corresponding elements of the XBAR 400.

Figure 11:
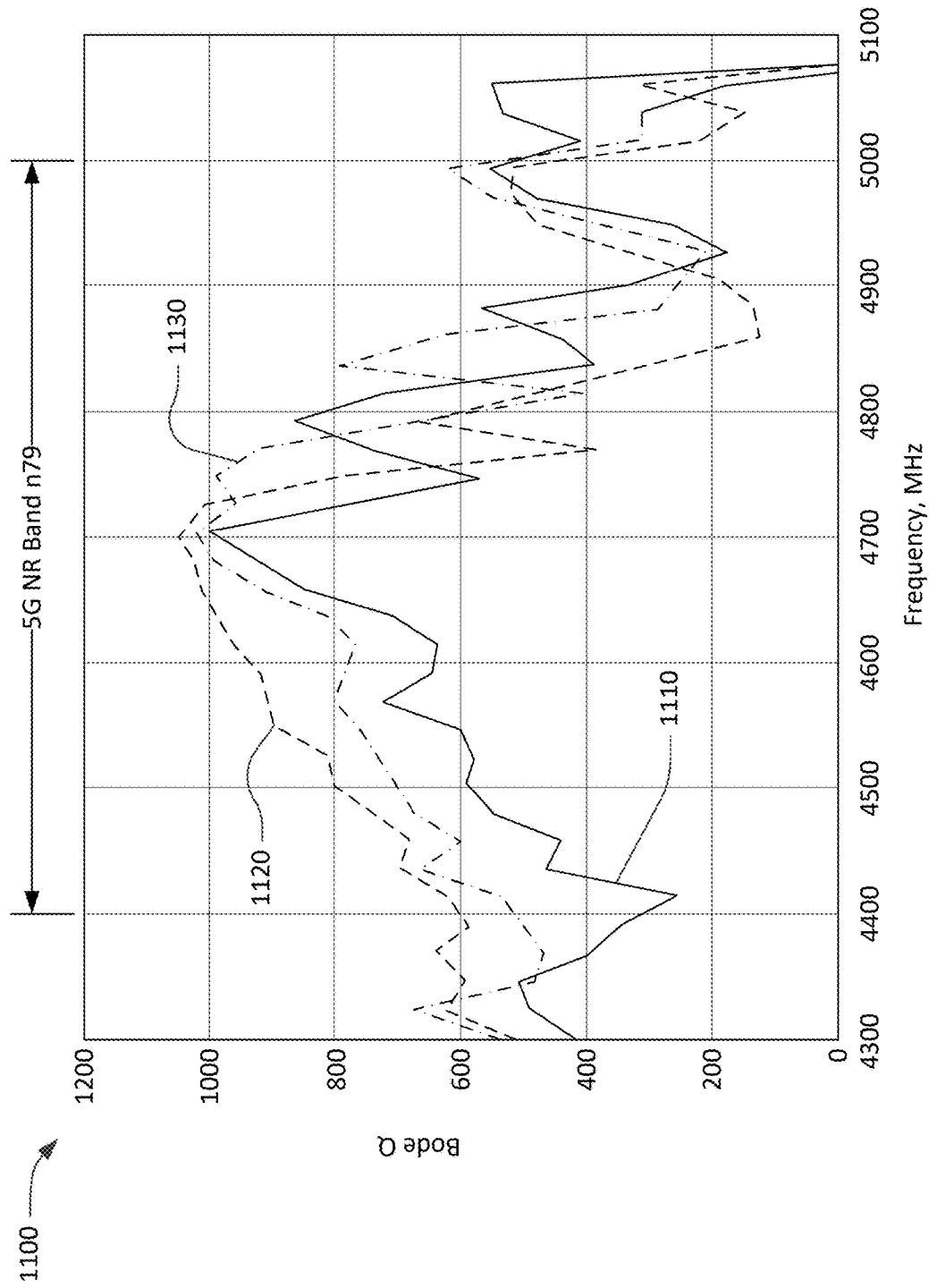
FIG. 11 is a graph comparing the Bode Q of XBARs with different acoustic confinement structures.

FIG. 11 shows a graph 1100 illustrating the relationship between Bode Q and the dimensions of a dielectric strip ACS divided into two portions as shown in FIG. 10. Specifically, the solid curve 1110 is a plot of the Bode Q of an exemplary XBAR without a dielectric strip ACS. The dashed curve 1120 is a plot of the Bode Q of an exemplary XBAR with a do1=2.0 μm=4.0td, dos=0.2 μm=0.4td, dg=2.0 μm=4.0td, and ts=15 nm=0.03td. The dot-dash curve 1130 is a plot of the Bode Q of an exemplary XBAR with do1=2.0 μm=4.0td, dos=2.0 μm=4.0td, dg=2.0 μm=4.0td, and ts=30 nm=0.06td.

Figure 12:
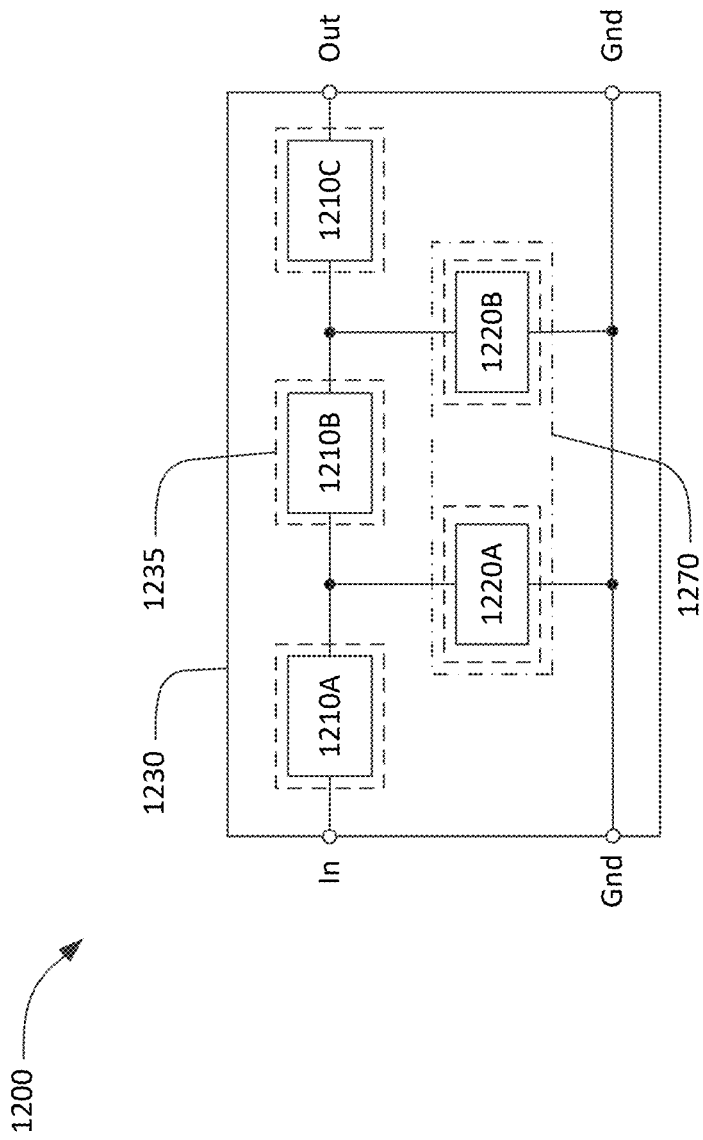
FIG. 12 is a schematic block diagram of a band-pass filter using acoustic resonators.

FIG. 12 is a schematic circuit diagram and layout for a high frequency band-pass filter 1200 using XBARs. The filter 1200 has a conventional ladder filter architecture including three series resonators 1210A, 1210B, 1210C and two shunt resonators 1220A, 1220B. The three series resonators 1210A, 1210B, and 1210C are connected in series between a first port and a second port (hence the term "series resonator"). In FIG. 12, the first and second ports are labeled "In" and "Out", respectively. However, the filter 1200 is bidirectional and either port may serve as the input or output of the filter. The two shunt resonators 1220A, 1220B are connected from nodes between the series resonators to ground. A filter may contain additional reactive components, such as capacitors and/or inductors, not shown in FIG. 12. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and one of the input, the output, or a node between two series resonators.

In the exemplary filter 1200, the three series resonators 1210A, 1210B, and 1210C and the two shunt resonators 1220A and 1220B of the filter 1200 are formed on a single plate 1230 of piezoelectric material bonded to a silicon substrate (not visible). In some filters, the series resonators and shunt resonators may be formed on different plates of piezoelectric material. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 12, the cavities are illustrated schematically as the dashed rectangles (such as the rectangle 1235). In this example, each IDT is disposed over a respective cavity. In other filters, the IDTs of two or more resonators may be disposed over a single cavity.

Each of the resonators 1210A, 1210B, 1210C, 1220A, and 1220B in the filter 1200 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 1200. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are positioned above the upper edge of the passband. In some filters, a dielectric layer (also called a "frequency setting layer"), represented by the dot-dash rectangle 1270, may be formed on the front and/or back surface of the shunt resonators to set the resonance frequencies of the shunt resonators lower relative to the resonance frequencies of the series resonators. In other filters, series resonators may have thinner piezoelectric plates than shunt resonators. In some filters, the series resonators and the shunt resonators may be fabricated on separate chips having different piezoelectric plate thicknesses.

Figure 13:
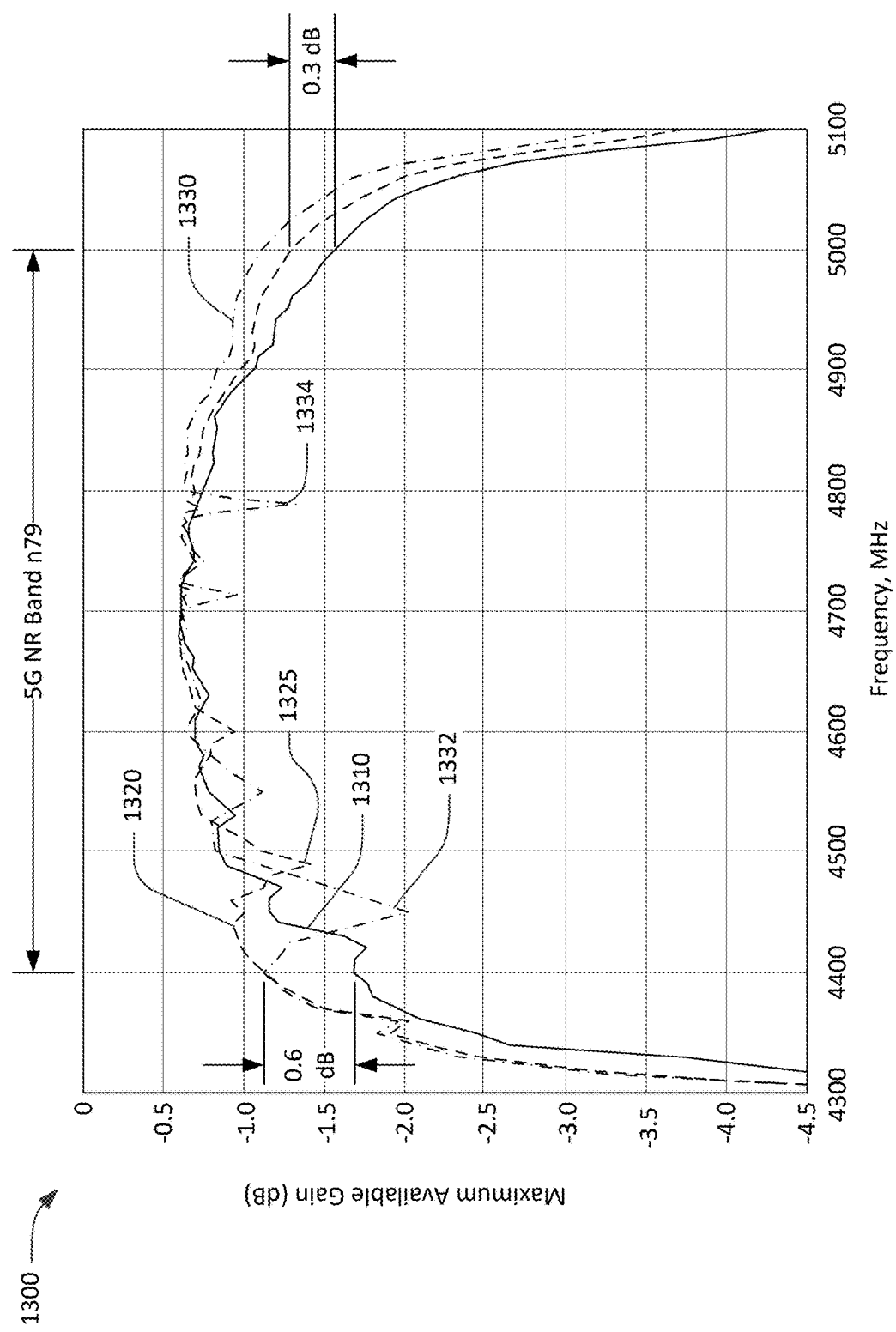
FIG. 13 is a graph comparing the performance of band-pass filters implemented using XBARs with and without acoustic confinement structures.

FIG. 13 is a graph 1300 illustrating the benefit of wide dielectric strip ACS. Specifically, the solid curve 1310 is a plot of maximum available gain of a band n79 bandpass filter including XBARs without any acoustic confinement structures. The dashed curve 1320 and the dot-dash curve 1330 are plots of maximum available gain of two similar band n79 bandpass filters including XBARs with dielectric strip acoustic confinement structures. All curves were generated from simulations of the bandpass filter using a finite element method.

The solid curve 1310 is a plot of maximum available gain of a band n79 bandpass filter with dielectric strip ACS on all resonators. The piezoelectric plate thickness is 370 nm as in previous examples. Shunt resonators have a dielectric layer 130 nm thick and series resonators have a dielectric layer 30 nm thick. The thickness is of the dielectric strip ACS of every resonator is 15 nm or 0.03td for shunt resonators and 0.0375td for series resonators. The total width dt of the dielectric strip ACS on each resonator is individually optimized and varies between 3 um and 6 um such that 6td≤dt≤15td. In general, dt for series resonators tends to be larger than dt for shunt resonators. Comparison of the solid curve 1310 and the dashed curve 1329 shows incorporation of a dielectric strip ACS on all of the XBARs of the filter increases the maximum available gain by 0.6 dB at the lower band edge and 0.3 dB at the upper band edge.

The dot-dash curve 1330 is a plot of maximum available gain of a band n79 bandpass filter similar to the previous example with the thickness ts of the dielectric strip ACS on series resonators increased to 25 nm or 0.0625td. Increasing the thickness of the dielectric strip ACS on the series resonators provides a further 0.2 dB of maximum available gain at the upper band edge at the expense of increasing the amplitude and number of spurs in the passband.

While the incorporation of wide dielectric strip ACS can reduce losses at the band edges of a bandpass filter, the ACS may introduce spurs or ripple within the passband of the filter, such as the spur 1325 in the dashed curve 1320 and the spurs 1332 and 1334 in the dot-dash curve 1330. Such spurs may be caused by acoustic modes that are confined to the dielectric strip ACS.

Spurs introduced by dielectric strip ACS can be minimized, if not eliminated, by varying the ACS structures within and between various resonators in the filter. For example, in the filter 1200 of FIG. 12, some or all of the resonators 1210A, 1210B, 1210C, 1220A, and 1220B may have dielectric strip ACS. A first resonator may have a dielectric strip ACS with first dimensions (i.e. do1, dg, ts as defined in FIG. 5) and a second resonator may have a dielectric strip ACS with at least dimension different from the corresponding dimension of the first resonator. Changing the ACS structure between resonators spreads the spurs over a wider frequency range and thus reduces the magnitude of the spur at any specific frequency.

Figure 14A:
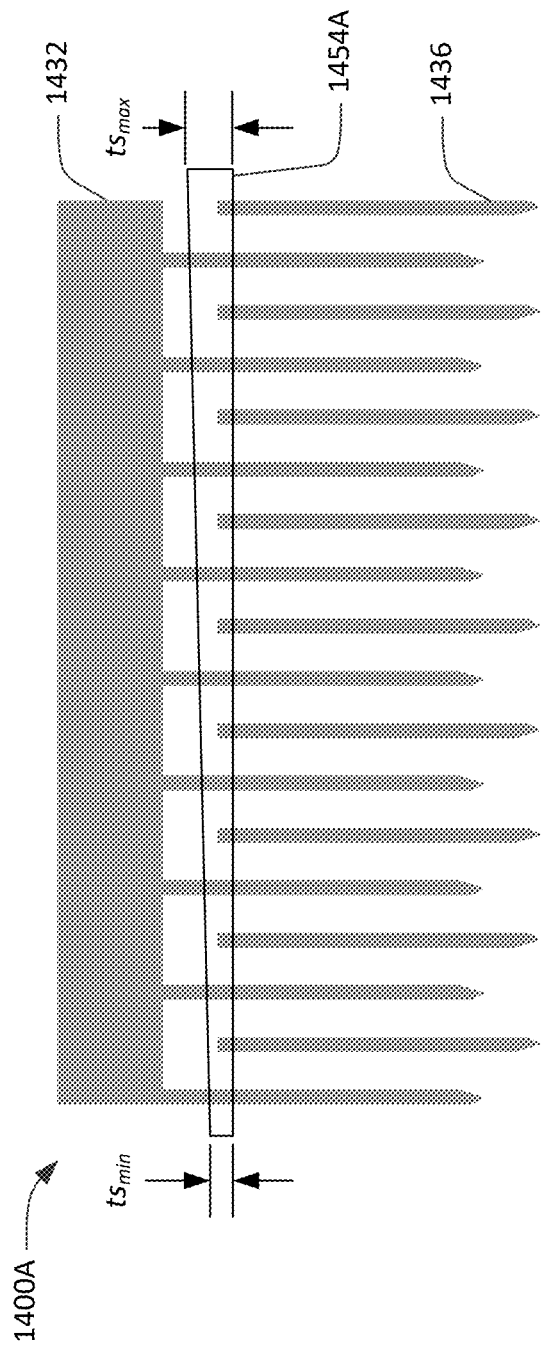
FIG. 14A and FIG. 14B are schematic plan views of different embodiments of oxide strip acoustic confinement structures.
Figure 14B:
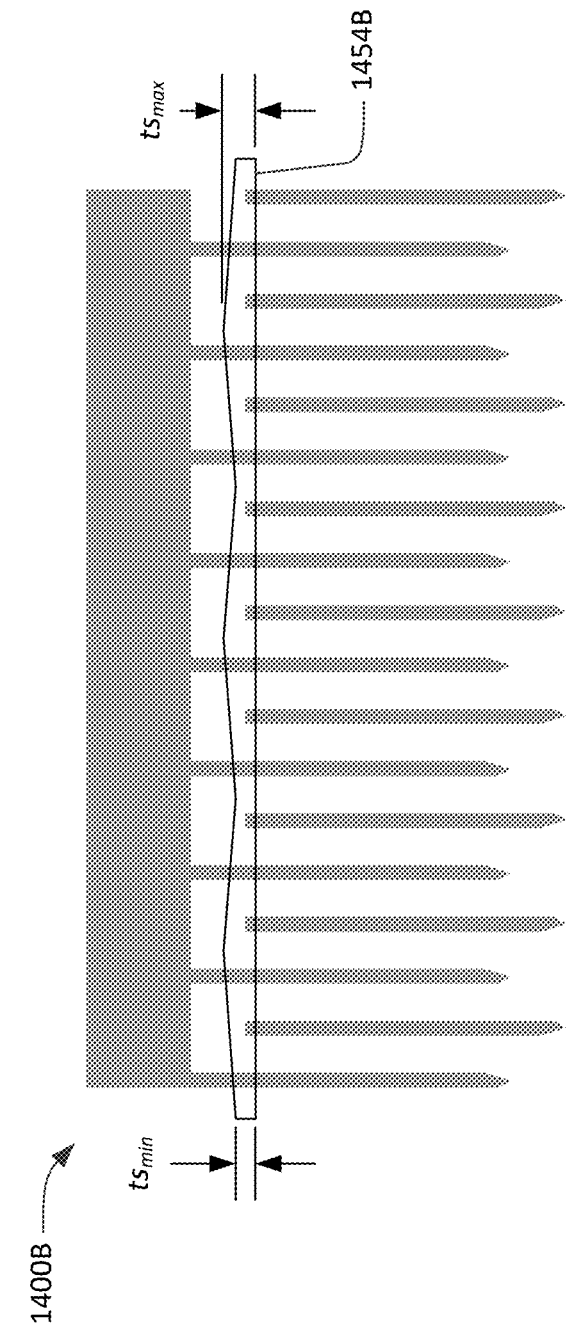

In addition, the dimensions of a dielectric strip ACS may be varied within a resonator. For example, FIG. 14A is a plan view of a portion of an IDT 1400A including a portion of a busbar 1432, portions of IDT fingers such as finger 1436, and a dielectric strip ACS 1454A. The width, in the aperture direction, of the dielectric strip ACS changes linearly from a minimum value $ts_{min}$ to a maximum value of $ts_{max}$. FIG. 14B is a plan view of a portion of a similar IDT 1400B where a width, in the aperture direction, of a dielectric strip ACS 1454B changes cyclically from a minimum value $ts_{min}$ to a maximum value of $ts_{max}$. While FIG. 14A and FIG. 14B illustrate the ACS width varying as a linear function of position along the length of the IDS, the ACS width may be a nonlinear function of position. The width, in the aperture direction of an ACS may vary in steps between two or more values. The steps may be aligned with or asynchronous with the IDT fingers. The ACS structure adjacent to the two busbars of an IDS may be the same or different.

In a filter with multiple XBARs, the dielectric strip ACSs of the various XBARs may be the same or different. Some or all of the XBARs may have dielectric strip ACS with different total width ds or different overlap dol with the IDT fingers. Some, all, or none of XBARs in a filter may have dielectric strip ACS that vary along the length of the respective IDTs. XBARs with dielectric strip ACS that vary along the length of the respective IDTs may vary in different manners.

Description of Methods

Figure 15:
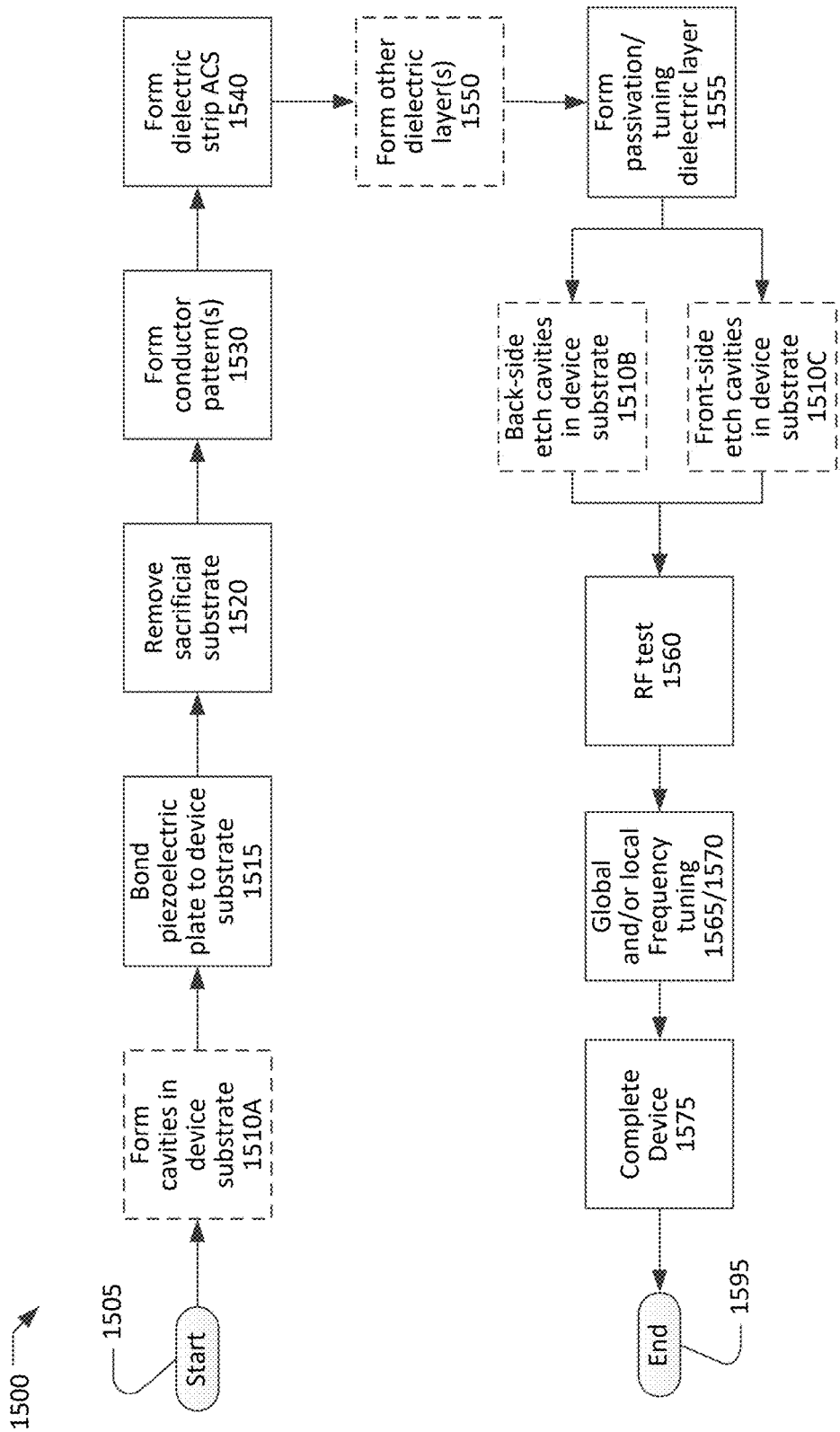
FIG. 15 is a flow chart of a method for fabricating an XBAR.

FIG. 15 is a simplified flow chart summarizing a process 1500 for fabricating a filter device incorporating XBARs with structures for reducing acoustic energy leakage. Specifically, the process 1500 is for fabricating a filter device including multiple XBARs, some of which may include a frequency setting dielectric or coating layer. The process 1500 starts at 1505 with a device substrate and a thin plate of piezoelectric material disposed on a sacrificial substrate. The process 1500 ends at 1595 with a completed filter device. The flow chart of FIG. 15 includes only major process steps. Various conventional process steps (e.g. surface preparation, cleaning, inspection, baking, annealing, monitoring, testing, etc.) may be performed before, between, after, and during the steps shown in FIG. 15.

While FIG. 15 generally describes a process for fabricating a single filter device, multiple filter devices may be fabricated simultaneously on a common wafer (consisting of a piezoelectric plate bonded to a substrate). In this case, each step of the process 1500 may be performed concurrently on all of the filter devices on the wafer.

The flow chart of FIG. 15 captures three variations of the process 1500 for making an XBAR which differ in when and how cavities are formed in the device substrate. The cavities may be formed at steps 1510A, 1510B, or 1510C. Only one of these steps is performed in each of the three variations of the process 1500.

The piezoelectric plate may typically be ZY-cut lithium niobate. The piezoelectric plate may be some other material and/or some other cut. The device substrate may preferably be silicon. The device substrate may be some other material that allows formation of deep cavities by etching or other processing.

In one variation of the process 1500, one or more cavities are formed in the device substrate at 1510A, before the piezoelectric plate is bonded to the substrate at 1515. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities may be formed using conventional photolithographic and etching techniques. Typically, the cavities formed at 1510A will not penetrate through the device substrate.

At 1515, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 1520, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 1520, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

A first conductor pattern, including IDTs of each XBAR, is formed at 1530 by depositing and patterning one or more conductor layers on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT bus bars and interconnections between the IDTs).

Each conductor pattern may be formed at 1530 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 1530 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1540, dielectric strip ACS may be formed. As previously described, the dielectric strip ACS may overlap the ends of the IDT fingers in the margins of the aperture and extend into the gaps between the ends of the IDT fingers and adjacent busbars. The dielectric strip ACS may be formed by depositing and patterning, using either etching or a lift-off technique, a dielectric thin film. The dielectric strip ACS may be silicon dioxide, silicon nitride, aluminum oxide, or some other dielectric material. The dielectric strip ACS may be multiple layers of different materials or a mixture of two or more materials.

At 1550, one or more frequency setting dielectric layer(s) may optionally be formed by depositing one or more layers of dielectric material on the front side of the piezoelectric plate. For example, a dielectric layer may be formed over the shunt resonators to lower the frequencies of the shunt resonators relative to the frequencies of the series resonators. The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only the shunt resonators. The formation of one or more frequency setting layers at 1550 may be performed before or after (as shown) the formation of the dielectric strip ACS at 1540.

At 1555, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 1500, the passivation/tuning dielectric layer may be formed after the cavities in the device substrate are etched at either 1510B or 1510C.

In a second variation of the process 1500, one or more cavities are formed in the back side of the device substrate at 1510B. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 1500, one or more cavities in the form of recesses in the device substrate may be formed at 1510C by etching the substrate using an etchant introduced through openings in the piezoelectric plate. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities formed at 1510C will not penetrate through the device substrate.

Ideally, after the cavities are formed at 1510B or 1510C, most or all of the filter devices on a wafer will meet a set of performance requirements. However, normal process tolerances will result in variations in parameters such as the thicknesses of dielectric layer formed at 1550 and 1555, variations in the thickness and line widths of conductors and IDT fingers formed at 1530, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 1555. The frequency of a filter device passband can be lowered by adding material to the passivation/tuning layer, and the frequency of the filter device passband can be increased by removing material to the passivation/tuning layer. Typically, the process 1500 is biased to produce filter devices with passbands that are initially lower than a required frequency range but can be tuned to the desired frequency range by removing material from the surface of the passivation/tuning layer.

At 1560, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 1565, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the passband of each filter device towards a desired frequency range. The test results from 1560 may be processed to generate a global contour map indicating the amount of material to be removed as a function of two-dimensional position on the wafer. The material is then removed in accordance with the contour map using the selective material removal tool.

At 1570, local frequency tuning may be performed in addition to, or instead of, the global frequency tuning performed at 1565. "Local" frequency tuning is performed with a spatial resolution smaller than an individual filter device. The test results from 1560 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 1565 and/or 1570, the filter device is completed at 1575. Actions that may occur at 1575 include forming bonding pads or solder bumps or other means for making connection between the device and external circuitry (if such pads were not formed at 1530); excising individual filter devices from a wafer containing multiple filter devices; other packaging steps; and additional testing. After each filter device is completed, the process ends at 1595.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator comprising:
    a substrate;
    a piezoelectric plate supported by the substrate, the piezoelectric plate including a diaphragm that is over a cavity of the acoustic resonator;
    an interdigital transducer (IDT) on a surface of the piezoelectric plate, the IDT comprising first and second sets of interleaved interdigital transducer (IDT) fingers extending from first and second busbars, respectively, wherein:
        the interleaved IDT fingers are on the diaphragm,
        the first set of IDT fingers extend from the first busbar towards the second busbar and the second set of IDT fingers extend from the second busbar towards the first busbar, and
        overlapping portions of the interleaved IDT fingers define an aperture of the acoustic resonator;
    a first dielectric strip that only partially overlaps the first and second sets of IDT fingers and extends into a first gap between ends of the second set of IDT fingers and the first busbar; and
    a second dielectric strip that only partially overlaps the first and second sets of IDT fingers and extends into a second gap between ends of the first set of IDT fingers and the second busbar.

2. The acoustic resonator of claim 1, wherein each of the first and second dielectric strips extend over an entire length of the IDT that is the center-to-center distance between the outermost fingers of the IDT.

3. The acoustic resonator of claim 1, wherein a thickness ts of each of the first and second dielectric strips and a thickness td of the diaphragm are related by the equation:

$0.008td \leq ts \leq 0.06td$.

4. The acoustic resonator of claim 1, wherein a width dol of each of the first and second margins of the aperture and a thickness td of the diaphragm are related by the equation:

$0.6td \leq dol \leq 3.0td$.

5. The acoustic resonator of claim 1, wherein a width ds of each of the first and second dielectric strips and a thickness td of the diaphragm are related by the equation:

$4.0td \leq ds \leq 15.0td$.

6. The acoustic resonator of claim 1, wherein at least one of a width ds, a width dol and a thickness ts of one or both of the first and second dielectric strips varies along a length of the IDT.

7. The acoustic resonator of claim 1, wherein the first dielectric strip comprises:
    a first portion in a first margin, and
    a second portion in the first gap between the first margin and the first busbar,
    wherein the first and second portions are not contiguous.

8. The acoustic resonator of claim 1, wherein the piezoelectric plate and the IDT are configured such that a radio frequency signal applied to the IDT excites a primary shear acoustic mode in the piezoelectric plate, the primary shear acoustic mode being a bulk shear mode where acoustic energy propagates along a direction substantially orthogonal to the surface of the piezoelectric plate, which is transverse to a direction of an electric field created by the first and second sets of IDT fingers.

9. The acoustic resonator of claim 8, wherein the piezoelectric plate is one of Z-cut lithium niobate and Z-cut lithium tantalate.

10. The acoustic resonator of claim 1, wherein:
    the first gap between the ends of the second set of IDT fingers and the first busbar has a width g, and
    the first dielectric strip has a portion disposed on the diaphragm having a width dg that is less then the width g.

11. A filter comprising:
    a plurality of bulk acoustic resonators, wherein the bulk acoustic resonators each comprise:
        a substrate;
        a piezoelectric plate supported by the substrate, the piezoelectric plate including a diaphragm that is over a cavity of the bulk acoustic resonator;
        a conductor pattern on a surface of the piezoelectric plate, the conductor pattern comprising an interdigital transducer (IDT) that includes first and second sets of interleaved interdigital transducer (IDT) fingers extending from first and second busbars, respectively, wherein:
            the interleaved IDT fingers are on the diaphragm,
            the first set of IDT fingers extend from the first busbar towards the second busbar and the second set of IDT fingers extend from the second busbar towards the first busbar, and
            overlapping portions of the interleaved IDT fingers define an aperture of the respective acoustic resonator;
    wherein at least one of the plurality of bulk acoustic resonators further comprises:
        a first dielectric strip that only partially overlaps the first and second sets of IDT fingers and extends into a first gap between ends of the second set of IDT fingers and the first busbar; and
        a second dielectric strip that only partially overlaps the first and second sets of IDT fingers and extends into a second gap between ends of the first set of IDT fingers and the second busbar.

12. The filter of claim 11, wherein, for the at least one bulk acoustic resonator, each of the first and second dielectric strips extend over an entire length of the IDT that is the center-to-center distance between the outermost fingers of the IDT.

13. The filter of claim 11, wherein a thickness ts of each of the first and second dielectric strips and a thickness td of the diaphragm are related by the equation:

$0.008td \leq ts \leq 0.06td$.

14. The filter of claim 11, wherein a width dol of each of the first and second margins of the aperture and a thickness td of the diaphragm are related by the equation:

$0.6td \leq dol \leq 3.0td$.

15. The filter of claim 11, wherein a width ds of each of the first and second dielectric strips and a thickness td of the diaphragm are related by the equation:

$4.0td \leq ds \leq 8.0td$.

16. The filter of claim 11, wherein at least one of a width ds, a width dol and a thickness ts of one or both of the first and second dielectric strips varies along a length of the IDT.

17. The filter of claim 11, wherein the first dielectric strip comprises:
 a first portion in a first margin of the aperture, and
 a second portion in the first gap between the first margin and the first busbar,
 wherein the first and second portions are not contiguous.

18. The filter of claim 11, wherein the piezoelectric plate and the IDT of each of the plurality of bulk acoustic resonators are configured such that a respective radio frequency signal applied to each IDT excites a respective primary shear acoustic mode in the piezoelectric plate, the primary shear acoustic mode being a bulk shear mode where acoustic energy propagates along a direction substantially orthogonal to the surface of the piezoelectric plate, which is transverse to a direction of an electric field created by the first and second sets of IDT fingers.

19. The filter of claim 11, wherein the piezoelectric plate is one of Z-cut lithium niobate and Z-cut lithium tantalate.

20. A method of fabricating an acoustic resonator comprising:
 forming an interdigital transducer (IDT) on a surface of a piezoelectric plate, the IDT comprising first and second sets of interleaved interdigital transducer (IDT) fingers extending from first and second busbars respectively, wherein:
  the interleaved IDT fingers are on a diaphragm comprising a portion of the piezoelectric plate that is over a cavity of the acoustic resonator,
  the first set of IDT fingers extend from the first busbar towards the second busbar and the second set of IDT fingers extend from the second busbar towards the first busbar, and
  overlapping portions of the interleaved IDT fingers define an aperture of the acoustic resonator; and
 forming first and second dielectric strips, wherein:
  the first dielectric strip only partially overlaps the IDT fingers and extends into a first gap between ends of the second set of IDT fingers and the first busbar, and
  the second dielectric strip only partially overlaps the IDT fingers and extends into a second gap between ends of the first set of IDT fingers and the second busbar.

* * * * *